(12) United States Patent
Kim

(10) Patent No.: US 11,812,572 B2
(45) Date of Patent: Nov. 7, 2023

(54) ELECTRONIC DEVICE CASE AND MANUFACTURING METHOD THEREFOR

(71) Applicant: Samsung Electronics Co., Ltd., Gyeonggi-do (KR)

(72) Inventor: Hyunsoo Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 356 days.

(21) Appl. No.: 17/257,911

(22) PCT Filed: Jul. 4, 2019

(86) PCT No.: PCT/KR2019/008234
§ 371 (c)(1),
(2) Date: Jan. 5, 2021

(87) PCT Pub. No.: WO2020/009502
PCT Pub. Date: Jan. 9, 2020

(65) Prior Publication Data
US 2021/0282284 A1    Sep. 9, 2021

(30) Foreign Application Priority Data

Jul. 6, 2018 (KR) .......................... 10-2018-0078571

(51) Int. Cl.
*H05K 5/02* (2006.01)
*G06F 1/16* (2006.01)
*B23B 27/20* (2006.01)

(52) U.S. Cl.
CPC .......... *H05K 5/0243* (2013.01); *B23B 27/20* (2013.01); *G06F 1/1633* (2013.01)

(58) Field of Classification Search
CPC .... H05K 5/0243; G06F 1/1633; G06F 1/1656
See application file for complete search history.

(56) References Cited

U.S. PATENT DOCUMENTS

| | | | |
|---|---|---|---|
| 6,233,825 B1 * | 5/2001 | DeGroot | G10D 3/02 29/896.22 |
| 8,896,991 B2 * | 11/2014 | Ternus | H05K 1/0281 361/679.55 |
| 9,384,916 B1 * | 7/2016 | Matsuoka | H01H 13/023 |

(Continued)

FOREIGN PATENT DOCUMENTS

| KR | 10-2016-0106805 A | 9/2016 |
|---|---|---|
| KR | 10-2016-0147090 A | 12/2016 |

(Continued)

*Primary Examiner* — Adrian S Wilson
(74) *Attorney, Agent, or Firm* — Cha & Reiter, LLC

(57) ABSTRACT

Various embodiments relate to a case included in an electronic device, and according to one embodiment, an electronic device case comprises: an exterior case formed by processing an upper surface of a base material of the electronic device case by means of a first head of a CNC device, and at least one pattern formed by processing a lateral surface of the exterior case by means of second and third heads of the CNC device, wherein at least one pattern includes first and second patterns, the first pattern is processed at the lateral surface of the exterior case by means of the second head, and the second pattern can be processed at the first pattern by means of the third head. In addition, other various embodiments are possible.

3 Claims, 14 Drawing Sheets

(56) References Cited

U.S. PATENT DOCUMENTS

| | | | | |
|---|---|---|---|---|
| D812,604 S * | 3/2018 | Akana | | D14/315 |
| 9,946,251 B2 * | 4/2018 | Valasek | | G05B 19/40937 |
| 9,988,725 B2 * | 6/2018 | Choi | | C25D 11/022 |
| 10,532,428 B2 * | 1/2020 | Russell-Clarke | | B23K 26/38 |
| 10,877,517 B2 * | 12/2020 | Baker | | H05K 1/11 |
| 11,394,420 B2 * | 7/2022 | Chun | | G06F 1/1626 |
| 2008/0257006 A1 * | 10/2008 | Durney | | B21D 5/00 |
| | | | | 72/379.2 |
| 2008/0317980 A1 * | 12/2008 | Yuba | | B44C 1/10 |
| | | | | 156/196 |
| 2010/0061040 A1 * | 3/2010 | Dabov | | H04M 1/026 |
| | | | | 361/679.01 |
| 2010/0091442 A1 * | 4/2010 | Theobald | | H05K 5/04 |
| | | | | 361/679.55 |
| 2010/0279075 A1 * | 11/2010 | Hou | | B32B 37/025 |
| | | | | 156/247 |
| 2011/0164365 A1 * | 7/2011 | McClure | | H01H 13/10 |
| | | | | 361/679.55 |
| 2013/0216740 A1 * | 8/2013 | Russell-Clarke | | G06F 1/1616 |
| | | | | 219/121.72 |
| 2015/0104615 A1 * | 4/2015 | Valasek | | G05B 19/40937 |
| | | | | 700/186 |
| 2015/0302624 A1 * | 10/2015 | Burke | | G06T 11/60 |
| | | | | 345/600 |
| 2016/0105206 A1 * | 4/2016 | Zhang | | H04B 1/3888 |
| | | | | 72/46 |
| 2017/0013735 A1 | 1/2017 | Choi et al. | | |
| 2017/0304948 A1 * | 10/2017 | Russell-Clarke | | G06F 1/1616 |
| 2017/0347476 A1 * | 11/2017 | Hwang | | C25D 11/12 |
| 2018/0008017 A1 | 1/2018 | Bazin et al. | | |
| 2018/0084880 A1 | 3/2018 | Kapinos et al. | | |
| 2018/0217579 A1 * | 8/2018 | Valasek | | G05B 19/40937 |
| 2018/0299924 A1 | 10/2018 | Seo et al. | | |
| 2022/0006479 A1 * | 1/2022 | Chun | | H04M 1/0202 |

FOREIGN PATENT DOCUMENTS

| | | |
|---|---|---|
| KR | 10-2017-0006709 A | 1/2017 |
| KR | 10-2017-0070636 A | 6/2017 |
| KR | 10-2018-0005600 A | 1/2018 |

* cited by examiner

ELECTRONIC DEVICE CASE AND MANUFACTURING METHOD THEREFOR

CROSS-REFERENCE TO RELATED APPLICATION(S)

This application is a National Phase Entry of PCT International Application No. PCT/KR2019/008234, which was filed on Jul. 4, 2019 and claims priority to Korean Patent Application No. 10-2018-0078571, which was filed on Jul. 6, 2018 in the Korean Intellectual Property Office, the contents of which are incorporated herein by reference.

BACKGROUND

1. Field

Various embodiments of the disclosure relate to a case of an electronic device, and a method for manufacturing a case of an electronic device.

2. Description of the Related Art

An electronic device may refer to a device configured to perform a specific function according to an installed program, and examples thereof may include a home appliance, an electronic wallet, a portable multimedia player, a mobile communication terminal, a notebook computer, a tablet PC, an image/sound playback device, a desktop/laptop computer, a vehicle navigation, and the like. For example, such electronic devices may output stored information in the form of sounds or images.

A portable computer, which is one of various exemplary electronic devices, may include a display unit configured to form images and a computer body which supports the display unit, and on which various kinds of hardware are mounted. The portable computers may include a laptop computer, a notebook computer, a palmtop computer, and the like, which are portable.

The case of an electronic device (which constitutes the exterior of the electronic device) may be made of a metal or nonmetal material, and the metallic case of the electronic device (which constitutes the exterior of the electronic device) may be processed by a computerized numerical control (CNC) device.

SUMMARY

If the case of an electronic device is processed by a CNC device, only the upper surface of the case of the electronic device can be processed, and no side surface of the case of the electronic device can be processed. As a result, the range in which the case of the electronic device is processed may be limited, and there may be restrictions on implementing a design in a refined and detailed pattern shape through the processing.

Therefore, various embodiments of the disclosure may provide an electronic device case and a method for manufacturing the same, wherein, when an electronic device case is processed by using a CNC device, not only the upper surface of the base material of the electronic device case, but also side surfaces thereof can be processed.

However, technical problems to be solved by various embodiments of the disclosure are not limited to the above-mentioned technical problems, and other technical problems may exist.

According to various embodiments of the disclosure, a case of an electronic device may include: an external case formed by processing an upper surface of a base of the case of the electronic device with a first head of a CNC device; and at least one pattern formed by processing a side surface of the external case with second and third heads of the CNC device. The at least one pattern may include first and second patterns, the first pattern may be processed on the side surface of the external case with the second head, and the second pattern may be processed on the first pattern with the third head.

According to various embodiments of the disclosure, a method for manufacturing a case of an electronic device may include: an operation of, when the table, on which the base of the case of the electronic device is positioned, is moved in the X axis direction or the Y axis direction by the first and second movement parts of the CNC device to process the upper surface of the base of the case of the electronic device, moving the first head of the CNC device and rotating the first head with the third movement part of the CNC device to process the upper surface of the case of the electronic device; an operation of rotating the second head of the CNC device with the third movement part to process the first pattern on the side surface of the base of the case of the electronic device; an operation of moving and rotating the third head of the CNC device with the first, second, and third movement parts to process the second pattern on the first pattern; an operation of processing the upper surface and the side surface of the base of the case of the electronic device through sand blasting; an operation of processing the upper surface and the side surface of the base of the case of the electronic device through anodizing; and an operation of processing the second pattern processed on the side surface of the base of the case of the electronic device with a fourth head of the CNC device through dia-cutting.

According to various embodiments of the disclosure, a method for manufacturing a case of an electronic device may include: an operation of, when the table, on which the base of the case of the electronic device is positioned, is moved in the X axis direction or the Y axis direction by the first and second movement parts of the CNC device to process the upper surface of the base of the case of the electronic device, moving the first head of the CNC device and rotating the first head with the third movement part of the CNC device to process the upper surface of the case of the electronic device; an operation of rotating the second head of the CNC device with the third movement part to process the first pattern on the side surface of the base of the case of the electronic device; an operation of moving and rotating the third head of the CNC device with the first, second, and third movement parts to process the second pattern on the first pattern; an operation of moving and rotating the third head of the CNC device with the first, second, and third movement parts to process a third pattern on the first pattern; an operation of processing the upper surface and the side surface of the base of the case of the electronic device through sand blasting; an operation of processing the upper surface and the side surface of the base of the case of the electronic device through anodizing; and an operation of processing the second and third patterns processed on the side surface of the base of the case of the electronic device with a fourth head of the CNC device through dia-cutting.

According to various embodiments of the disclosure, a method for manufacturing a case of an electronic device may include: an operation of, when the table, on which the base of the case of the electronic device is positioned, is moved in the X axis direction or the Y axis direction by the first and second movement parts of the CNC device to process the upper surface of the base of the case of the electronic device, moving the first head of the CNC device and rotating the first head with the third movement part of the CNC device to process the upper surface of the case of the electronic device; an operation of processing the base of the case of the electronic device through sand blasting; an operation of processing the base of the case of the electronic device through first anodizing; an operation of rotating the second head of the CNC device with the third movement part to process the first pattern on the side surface of the base of the case of the electronic device; an operation of moving and rotating the third head of the CNC device with the first, second, and third movement parts to process the second pattern on the first pattern; an operation of processing the upper surface and the side surface of the base of the case of the electronic device through second anodizing; and an operation of processing the second pattern processed on the side surface of the base of the case of the electronic device with a fourth head of the CNC device through dia-cutting.

According to at least one of the above-mentioned technical solutions of the disclosure, at least one pattern is formed on the upper surface and side surfaces of the base material of an electronic device case according to an embodiment of the disclosure by processing the same with a CNC device such that the exterior of the electronic device case can be implemented to have a refined and detailed pattern-shape design. In addition, the exterior of the electronic device case can be processed to have a design shape which cannot be processed by using etching, laser, or presses. As a result, the exterior of the product can be formed in a high-quality shape, and a refined and precise design can be implemented, thereby improving the quality of the exterior of the product.

DETAILED DESCRIPTION

Figure 1:
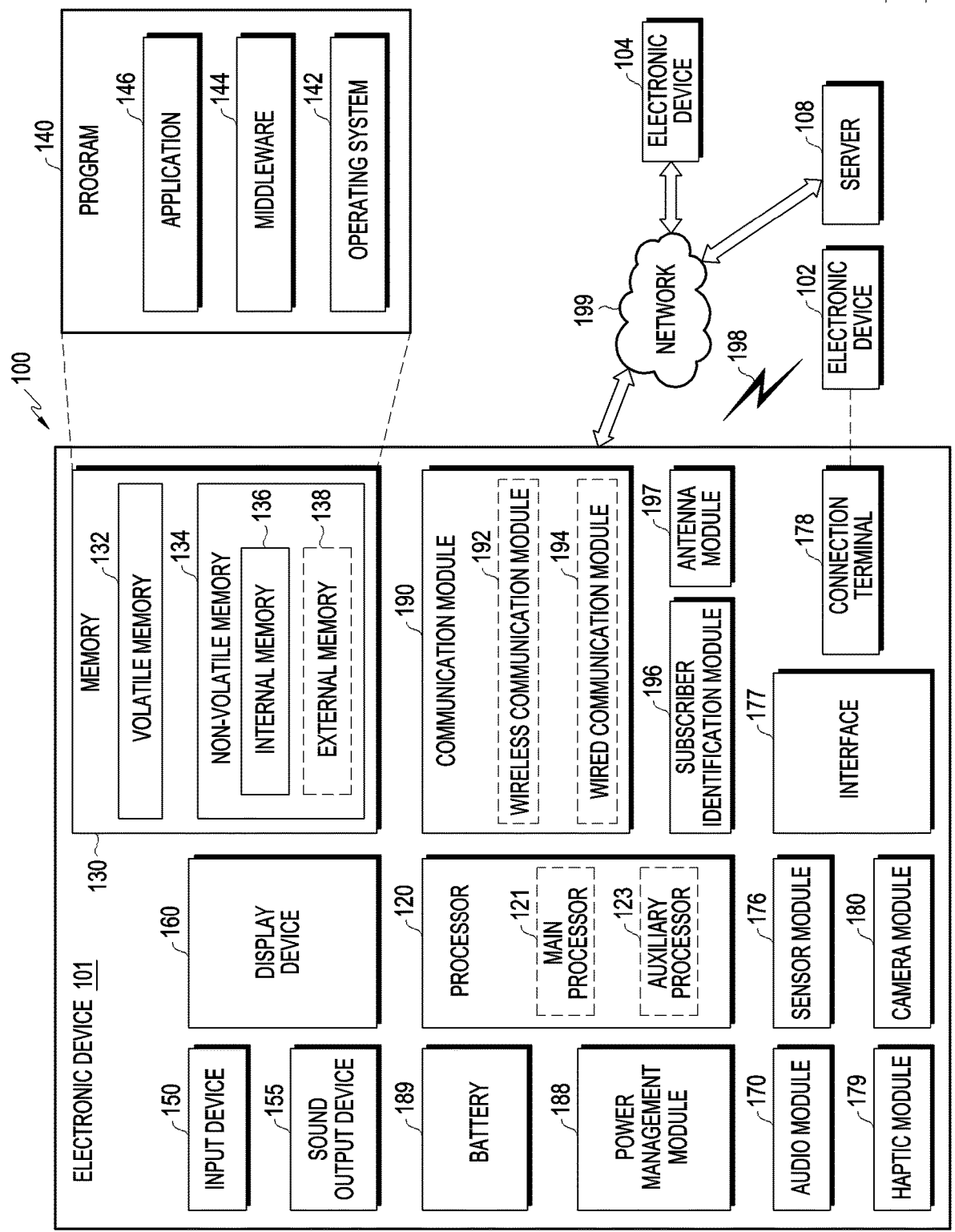
FIG. 1 illustrates a block diagram of an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by a component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and support a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and at least one antenna appropriate for a communication scheme used in the communication network, such as the first network 198 or the second network 199, may be selected, for example, by the communication module 190 from the one or more antennas. The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device (e.g., a laptop PC), a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., a program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

FIGS. 2A to 2D are views illustrating a process of processing a case 200 of an electronic device according to various embodiments of the disclosure.

Referring to FIGS. 2A to 2D, a case 200 of an electronic device according to various embodiments may be processed by using a CNC device 240, and for example, a base 210 of the case 200 of the electronic device may be positioned and fixed on a table 240a of the CNC device 240. An upper surface of the case 200 of the electronic device may be processed by using a first head 241 of the CNC device 240. For example, the upper surface of the base 210 of the case 200 of the electronic device is cut by the first head 241 to manufacture an external case of the case 200 of the electronic device.

According to an embodiment, the external case may include at least one of a notebook case, a mobile communication terminal case, a smartphone case, a tablet case, an electronic notebook case, a portable multimedia player case, a desktop/laptop computer case, and a navigation device case. In the present embodiment, the disclosed case will be exemplified as the external case but the disclosure is not limited thereto. For example, any external case of an electronic device may be variously applied as the external case. In the present embodiment, the external case may be a notebook case. The notebook case may include a first case 221 including a display (not illustrated) and a second case 220 including a keypad (not illustrated).

When a side surface of the second case of the external case is processed first, at least one pattern may be processed on the side surface of the second case 220 by using a second head 242 and a third head 243 of the CNC device 240. The at least one pattern may include the first and second patterns 231 and 232, and a high gloss may be formed on the side surface of the second case 220 of the external case, in which the first and second patterns are disposed, by using a fourth head 244 of the CNC device 240.

According to an embodiment, the CNC device 240 may refer to a device that moves the first, second, third, and fourth heads with first, second, and third movement parts for punching, cutting, and high glossing whereby a case of a metallic or nonmetallic electronic device positioned on the table 240a is made to have various shapes under a precise numerical control of a controller based on computation of a computer, which will be described below.

According to an embodiment, the material of the base 210 of the case 200 of the electronic device may include at least one of a metal material, a synthetic resin material, a wood material, and an artificial marble material, the base 210 of the case 200 of the electronic device according to the present embodiment may include a metal material, and the metal material may include at least one of aluminum, magnesium, titanium, and stainless steel. In the present embodiment, in addition to the disclosed metal material, various metal materials may be applied as the material of the base 210 of the case 200 of the electronic device. In the present embodiment, the material of the base 210 of the case 200 of the electronic device may be aluminum.

Figure 2A:
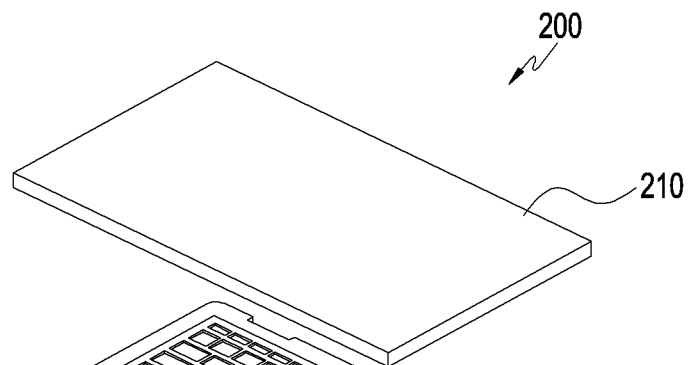
FIGS. 2A to 2D are views illustrating a process of processing a case of an electronic device according to various embodiments of the disclosure.

As illustrated in FIG. 2A mentioned above, a disk of the base 210 of the case 200 of the electronic device of an aluminum material is positioned on the table 240a. In this state, precise numerical values for manufacturing the second case 220 of the external case by using the base 210 of the case 200 of the electronic device may be input to a controller 246 of the CNC device 240, and the controller 246 may control driving of at least one driving motor 245 according to the input numerical values.

The first movement part (not illustrated) and the second movement part (not illustrated) may move the first head 241 disposed on the upper surface of the table 240a in the X axis direction or the Y axis direction through driving of the at least one driving motor 245. The third movement part (not illustrated) may move the first head 241 disposed on the upper surface of the table 240a in the Z axis direction through driving of the at least one driving motor 245. In this way, the first head 241 is moved and rotated in the X axis direction, the Y axis direction, and the Z axis direction by the first, second, and third movement parts (not illustrated) to process the upper surface of the base 210 of the case 200 of the electronic device. The base 210 of the case 200 of the electronic device may be processed by the first head 241 to constitute the second case 220 of the external case.

Figure 2B:
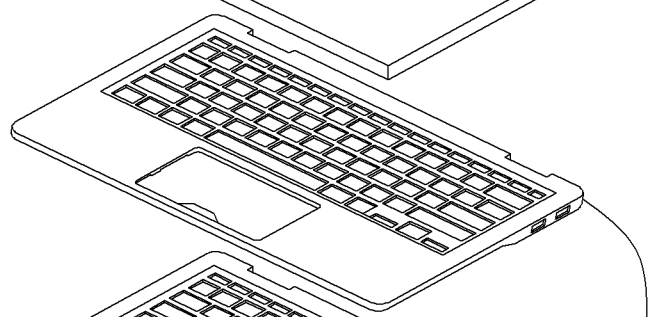

As illustrated in FIG. 2b, the second head 242 may be made to face a side surface of the second case 200 of the external case, and may be rotated by the third movement part (not illustrated) and the second head 242 may be rotated along the side surface of the second case 220 as well. Then, the second head 242 may process the first pattern 231 of a transverse line shape on a side surface of the second case 220.

Figure 2C:
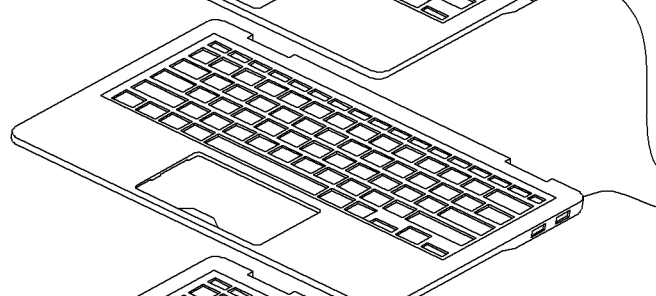

As illustrated in FIG. 2C, the third head 243 may be made to face a side surface of the second case 220. Then, the third head 243 may be made to face the first pattern 231 formed on the side surface or the second case 220, and in this state, the third head 243 may be moved in the X axis direction and the Y axis direction by the first and second movement parts (not illustrated) and may be moved upwards and downwards and rotated in the Z axis direction by the third movement part (not illustrated).

If the third movement part (not illustrated) moves the third head 243 upwards and downwards in the Z axis direction and rotates the third head 243, a pattern of a plurality of longitudinal line shapes may be formed in the first pattern 231. A plurality of a longitudinal line shape may be formed on the first pattern 231 of a transverse line shape may be formed on a side surface of the second case 220, and the second pattern 232 may be formed while the first pattern of the transverse line shape crosses the pattern of the longitudinal line shape.

In this way, the second pattern 232 may include at least one of a dual pattern, a pattern of a jewelry shape, and a pattern of a diamond shape. Here, the second pattern 232 may include various other shapes, in addition to the disclosed pattern shape. In the present embodiment, the second pattern 232 may include a pattern of a diamond shape.

Figure 2D:
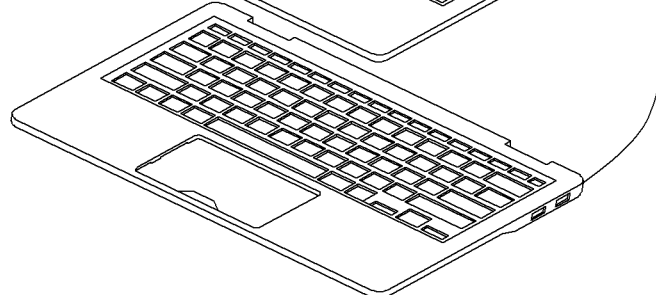

As illustrated in FIG. 2D, an upper surface and a side surface of the second case 220 may be processed through sand blasting or anodizing to form a high gloss.

The fourth head 244 may be made to face the second pattern 232 to form a high gloss on the second case 220, in which the second pattern 232 is formed, and the fourth head 244 may be rotated by the third movement part (not illustrated). Then, the second pattern 232 may be processed by the fourth head 244 through dia-cutting, and a high gloss may be formed as well.

Figure 3:
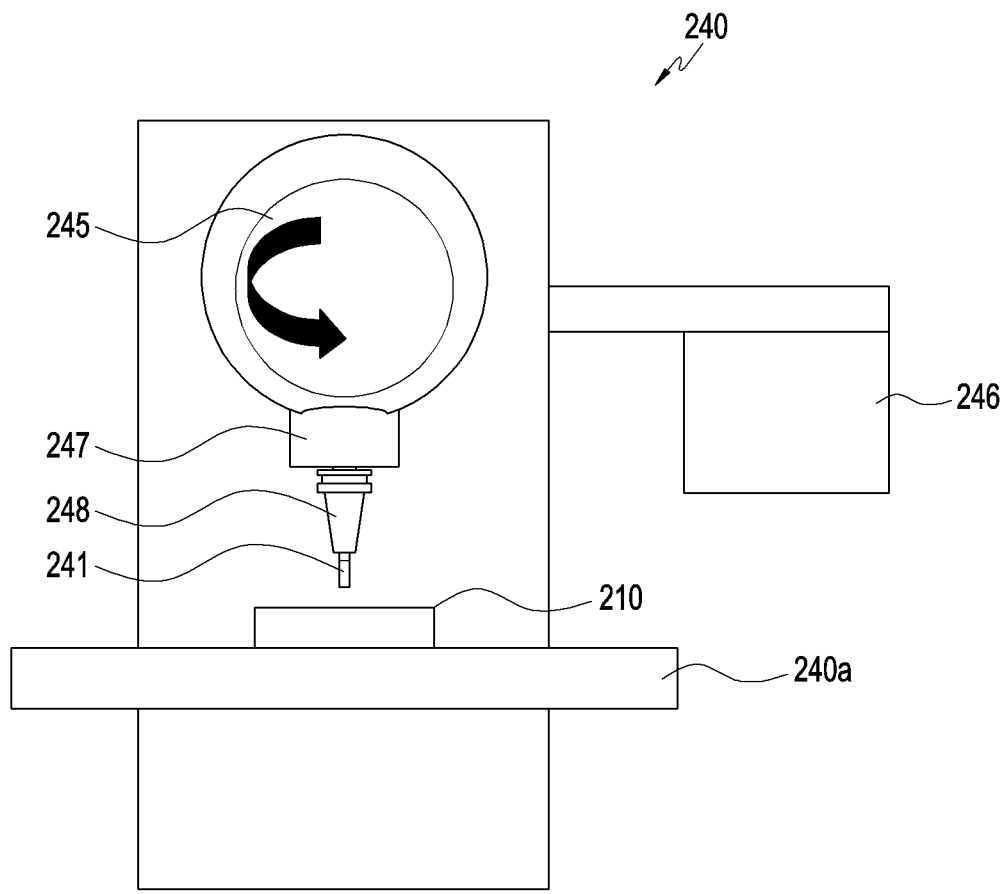
FIG. 3 is a view schematically illustrating a configuration of a CNC device according to various embodiments of the disclosure.
Figure 4:
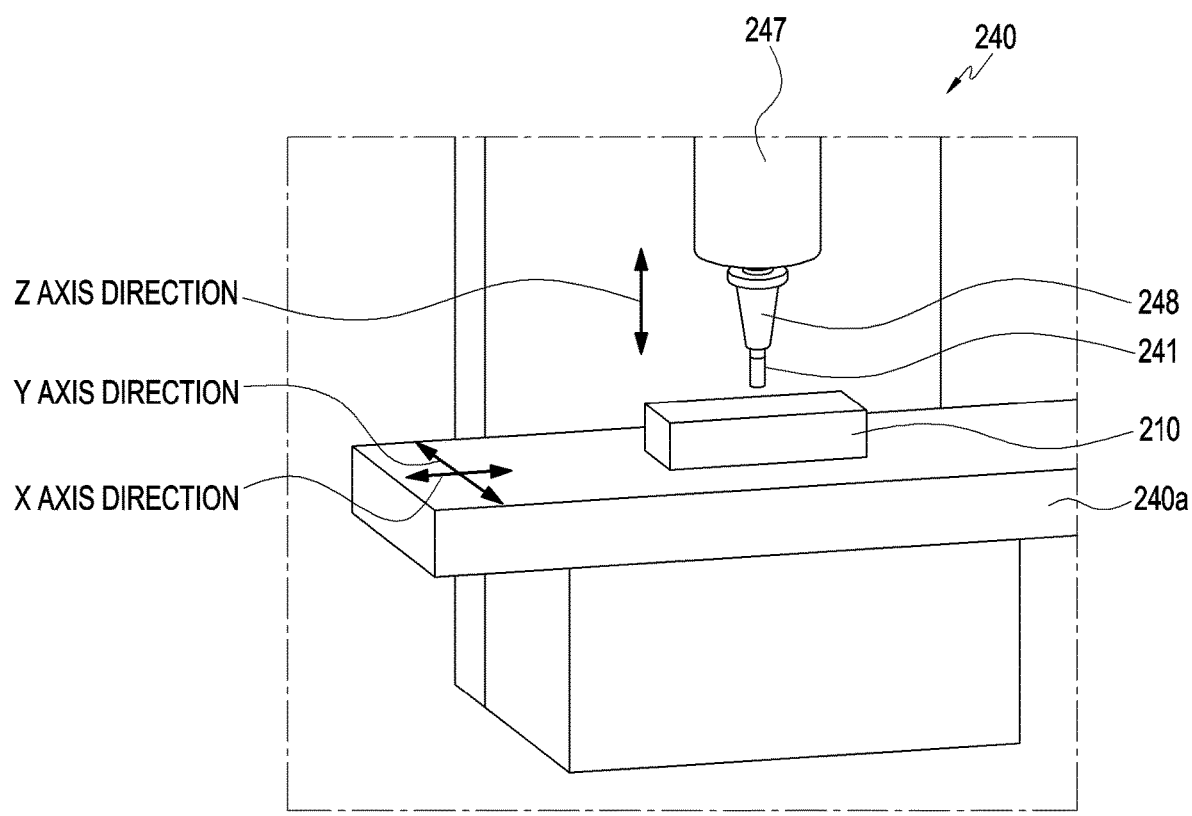
FIG. 4 is a view schematically illustrating a driving state of a CNC device according to various embodiments of the disclosure.

FIG. 3 is a view schematically illustrating a configuration of a CNC device 240 according to various embodiments of the disclosure. FIG. 4 is a perspective view schematically illustrating a driving state of a CNC device 240 according to various embodiments of the disclosure.

Referring to FIGS. 3 and 4, the CNC device 240 may include a table 240a, a first movement part (not illustrated) and a second movement part (not illustrated), first, second, third, and fourth heads 241, 242, 243, and 244, at least one driving motor 245, and a controller 246. The table 240a may be fixed after the base 210 of the case 200 of the electronic device is positioned on the table 240a. The first movement part (not illustrated) and the second movement part (not illustrated) may move the table 240a, to which the base 210 of the case 200 of the electronic device is fixed, in the X axis direction or the Y axis direction according to driving of the at least one driving motor 245. The first head 241 may be disposed by a spindle 247 and a holder 248 provided on an upper surface of the table 240a, to which the base 210 of the case 200 of the electronic device is fixed, the table 240a may be moved in the X axis direction or the Y axis direction by the first and second movement parts (not illustrated) so that the first head 241 processes the upper surface of the base 210 of the case 200 of the electronic device, and the first head 241 may be moved in the Z axis direction by the third movement part (not illustrated) to process the upper surface or the case 200 of the electronic device as well.

The second head (e.g., 242 of FIG. 5B) may be mounted to process the side surface of the case 200 of the electronic device after the first head 241 mounted on the spindle 247 and the holder 248 is separated.

The second head (e.g., 242 of FIG. 5B) may be rotated by the third movement part (not illustrated), and a first pattern (e.g., 231 of FIG. 5B) of a transverse line shape may be processed on the side surface of the base 210 of the case 200 of the electronic device.

The third head (e.g., 243 of FIG. 6B) may be mounted to process a second pattern (e.g., 232 of FIG. 6B) on the side surface of the case 200 of the electronic device after the second head (e.g., 242 of FIG. 5B) mounted on the spindle 247 and the holder 248 is separated.

Figure 5B:
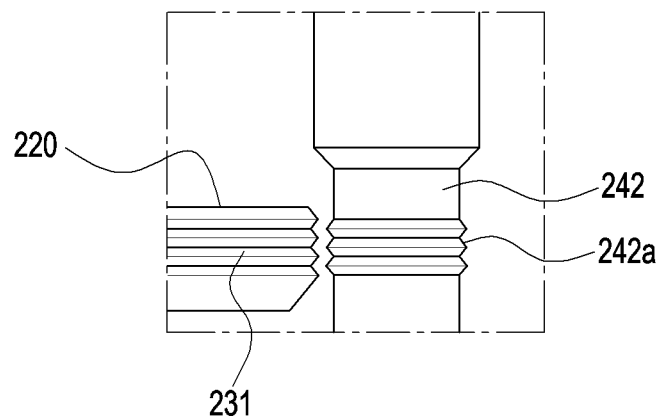
Figure 6A:
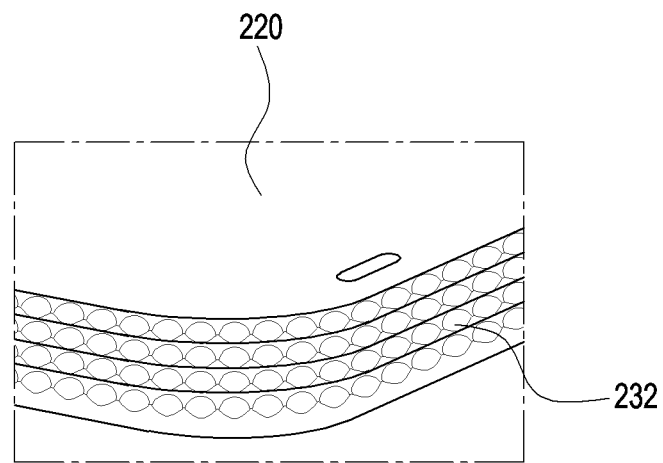
FIGS. 6A and 6B are views illustrating a process of processing a side surface of a base of a case of an electronic device with a third head of a CNC device according to various embodiments of the disclosure.
Figure 6B:
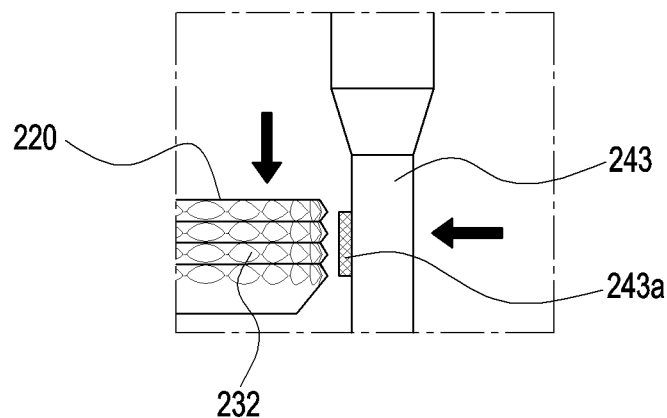

The third head 243 may be moved and rotated by the first, second, and third movement parts (not illustrated) to form a pattern of a longitudinal line shape on the first pattern (e.g., 231 of FIG. 5B) on the side surface of the base 210 of the case 200 of the electronic device and process the second pattern (e.g., 232 of FIG. 6B).

The fourth head (e.g., 244 of FIG. 7B) may be mounted to process the side surface of the case 200 of the electronic device with a high gloss after the third head (e.g., 243 of FIG. 6B) mounted on the spindle 247 and the holder 248 is separated.

The fourth head (e.g., 244 of FIG. 7B) may be rotated by the third movement part (not illustrated) to process the second pattern (e.g., 232 of FIG. 6B) with a high gloss.

The at least one driving motor 245 may rotate the first, second, and third movement parts (not illustrated), and driving of the at least one driving motor 245 may be controlled by the controller 246.

Figure 5A:
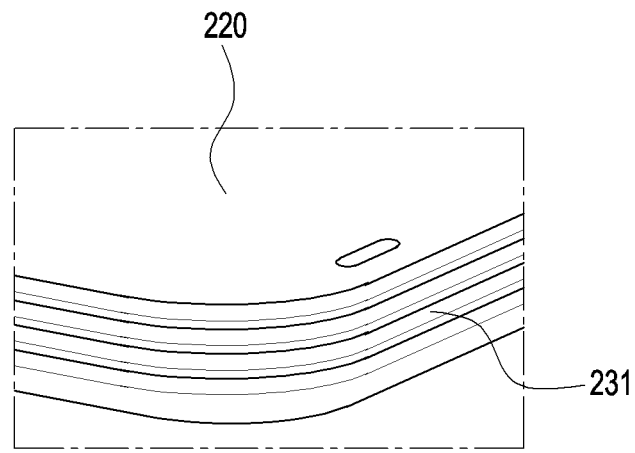
FIGS. 5A and 5B are views illustrating a process of processing a side surface of a base of a case of an electronic device with a second head of a CNC device according to various embodiments of the disclosure.

FIGS. 5A and 5B are views illustrating a process of processing a side surface of a base 210 of a case 200 of an electronic device with a second head 242 of a CNC device 240 according to various embodiments of the disclosure.

Figure 7A:
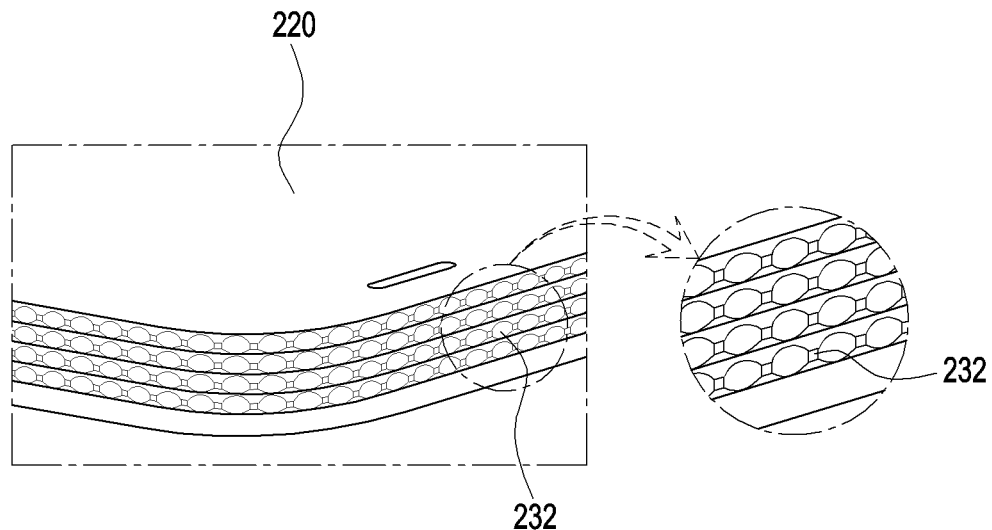
FIGS. 7A and 7B are views illustrating a process of processing a side surface of a base of a case of an electronic device with a fourth head of a CNC device according to various embodiments of the disclosure.
Figure 7B:
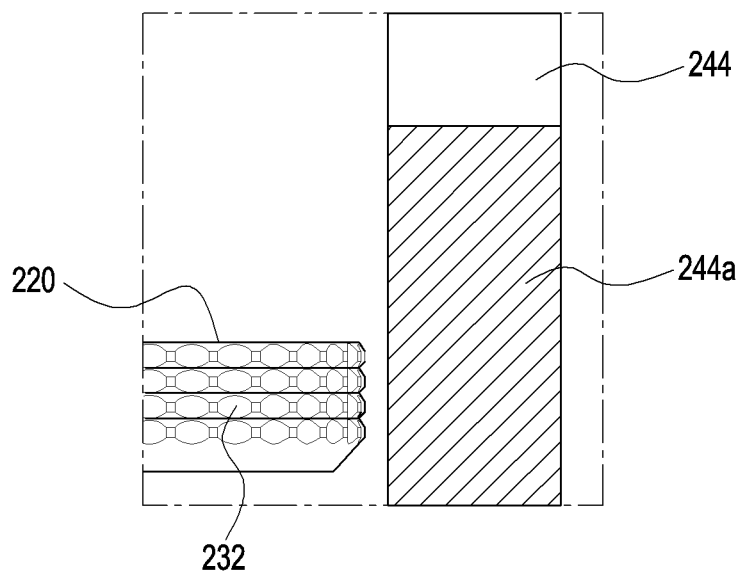

FIGS. 6A and 6B are views illustrating a process of processing a side surface of a base 210 of a case 200 of an electronic device with a third head 243 of a CNC device 240 according to various embodiments of the disclosure. FIGS. 7A and 7B are views illustrating a process of processing a side surface of a base 210 of a case 200 of an electronic device with a fourth head 244 of a CNC device 240 according to various embodiments of the disclosure.

Referring to FIGS. 5A and 5B, an upper surface of the base 210 of the case 200 of the electronic device may be processed to have the shape of the second case 220 of the external case of the notebook by moving and rotating the first head 241. The first head 241 may be provided with a first processing blade (not illustrated) to process the shape of the second case 220 of the notebook.

In this state, the second head 242 may be made to face the side surface of the second case 220, and may be rotated by the third movement part (not illustrated). Then, the second head 242 may process the side surface of the second case 220 while rotating along the side surface of the second case 220. The second head 242 may form the first pattern 231 of a transverse line shape on a side surface of the base 210 of the case 200 of the electronic device. The second head 242 may be provided with a second processing blade 242a to process the shape of the first pattern 231 on the side surface of the second case 220.

As illustrated in FIGS. 6A and 6B, the third head 243 may be made to face the first pattern 231 formed on the side surface of the second case 220. In this state, the third head 243 may be moved in the X axis direction and the Y axis direction by the first and second movement parts (not illustrated), and may be moved upwards and downwards in the Z axis direction and be rotated by the third movement part (not illustrated).

If the third movement part (not illustrated) moves the third head 243 upwards and downwards in the Z axis direction and rotates the third head 243, a pattern of a plurality of longitudinal line shapes may be formed in the first pattern 231 of the transverse line shape. The second pattern 232 may be formed on the side surface of the second case 220 by forming a pattern of a plurality of longitudinal line shapes in the first pattern 231 of a transverse line shape. For example, the third head 243 may form a recess of a plurality of longitudinal line shapes by a predetermined depth in the inside of the first pattern 231 and may form the second pattern 232 as well. A pattern of a plurality of longitudinal line shapes may be formed to cross the pattern of the transverse line shape of the first pattern 231. In this case, the second pattern 232 may include a pattern of a diamond shape.

The third head 243 may be provided with a third processing blade 243a to process the second pattern 232 on the side surface of the second case 220.

As illustrated in FIGS. 7A and 7B, the second pattern 232 may be processed through sand blasting or anodizing to form a high gloss.

The fourth head 244 may be made to face the second pattern 232, and the fourth head 244 may be rotated by the third movement part (not illustrated). Then, the second pattern 232 may be processed by the fourth head 244 through dia-cutting, and a high gloss may be formed as well.

The fourth head 244 may be provided with a fourth processing blade 244a to process the side or the second case 220 with a high gloss. The fourth processing blade 244a may include a high gloss blade.

According to an embodiment, an upper surface of the base 210 of the case 200 of the electronic device may be processed to have the shape of the second case 220 by moving and rotating the first head 241. The first pattern 231 may include at least one of a pattern of a transverse line shape or a pattern of a longitudinal line shape. Then, when the first pattern 231 of a longitudinal line shape is selected and processed on the side surface of the second case 220, first, a pattern of a longitudinal line shape may be formed on the side surface of the second case 220 by using the third head 243, and then, a pattern of a transverse line shape may be formed on the pattern of the longitudinal line shape by using the second head 242. Then, the second pattern 232 that is a pattern of a diamond shape may be formed on the side surface of the second case 220.

Figure 8A:
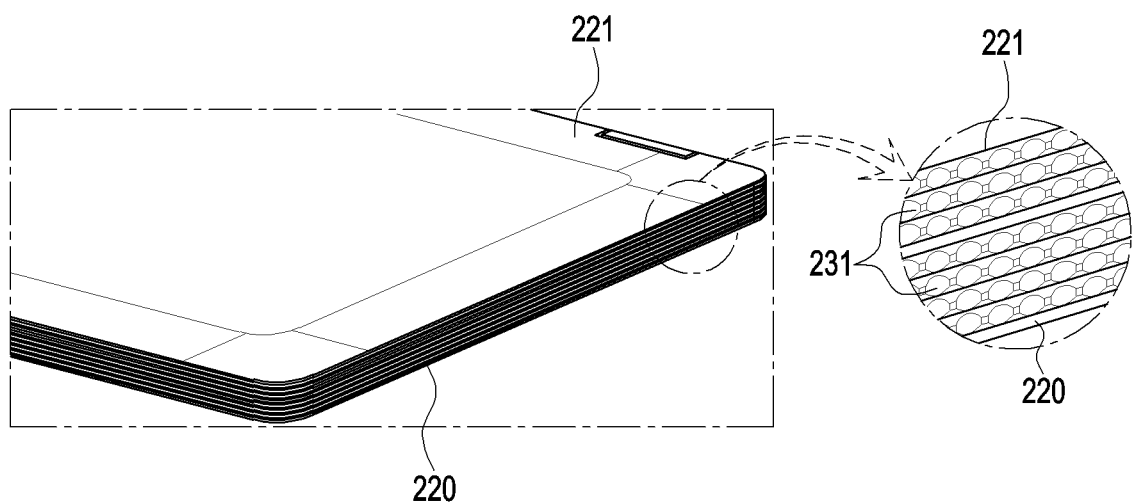
FIG. 8A is a perspective view illustrating an external case including first and second cases of the case of the electronic device according to various embodiments of the disclosure.

As illustrated in FIG. 8A, the first pattern 231 and the second pattern (e.g., 232 of FIG. 7B) may be formed on the side surface of the first case 221 of the external case in advance through processing of the first head (e.g., 241 of FIG. 3), the second head (e.g., 242 of FIG. 5B), the third head (e.g., 243 of FIG. 6B), and the fourth head (e.g., 244 of FIG. 7B) of the CNC device (e.g., 200 of FIG. 2). For example, the first case 221 of the external case may be provided with a display (e.g., an LCD or a touch screen) (not illustrated) of a notebook, and the second case 220 of the external case may be provided with a keypad (not illustrated) of the notebook. For example, the side surface of the first case 221 of the external case also may be processed by applying the process of the side surface of the second case 220, which has been mentioned above, in the same way.

In this way, when the first pattern 231 of a longitudinal line shape is selected and processed on the side surface of the first case 221 or the side surface of the second case 220, the third head 232 may be processed on the side surface of the first case 221 or the side surface of the second case 220 first instead of the process of the second head 242, and then the process of the second head 242 may be performed. Accordingly, the second pattern 232 that is a pattern of the same diamond shape may be formed even though the sequences of the process of the third head 243 and the process of the second head 242 are reversed. A diamond shape that is the second pattern 232 may be formed on the side surface of the first case 221 or the side surface of the second case 220 even though a pattern of a longitudinal line shape is formed on the side surface of the first case 221 or the side surface of the second case 220 by the third head 243 first and a pattern of the transverse line shape is then formed by the second head 242.

In this way, because the first and second patterns 231 and 232 are formed on the upper surface and the side surface of the first case 221 or the upper surface and the side surface of the second case 220 through processing of the first, second, third, and fourth heads 241, 242, 243, and 244, an external appearance of the product can be made refined, a design of a pattern shape can be realized in detail, a shape of a high quality can be achieved by forming a pattern of a diamond shape on a side surface of the product, and a design can be realized in a refined and precise way. Accordingly, the quality of the external appearance of the product can be improved.

Figure 8B:
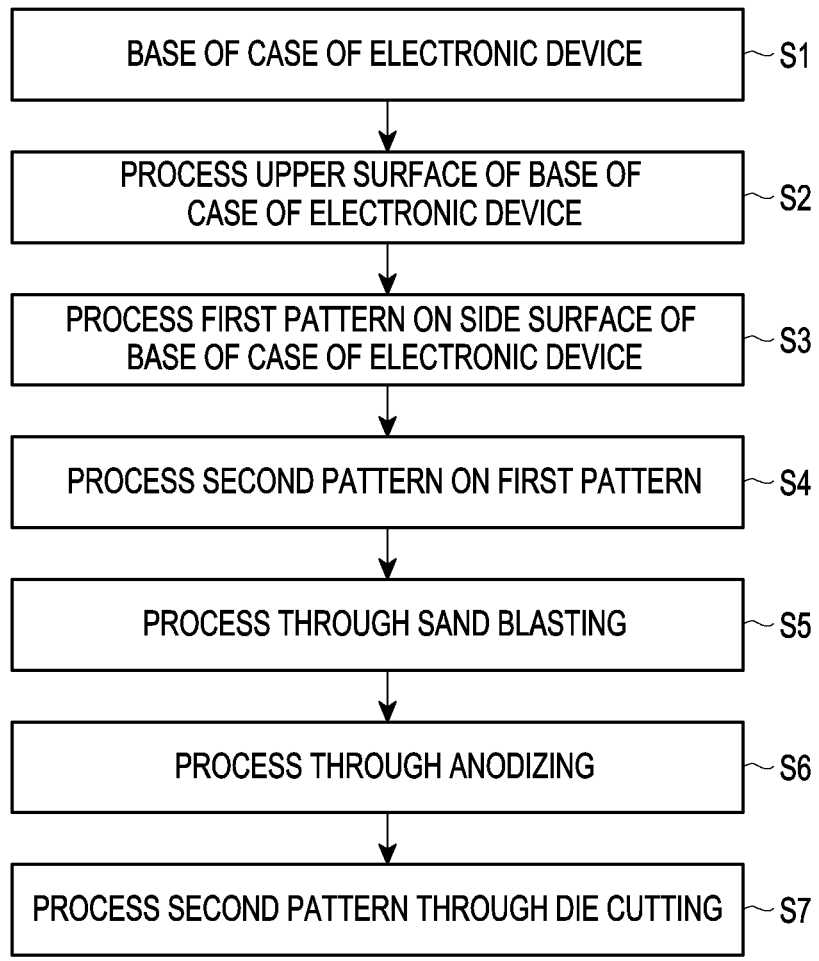
FIG. 8B is a process flowchart illustrating a method for manufacturing a case of an electronic device according to various embodiments of the disclosure.

FIG. 8B is a process flowchart illustrating a method for manufacturing a case 200 of an electronic device according to various embodiments of the disclosure.

Referring to FIG. 8B, first, as described above with reference to FIGS. 2 to 4, the base 210 of the case 200 of the electronic device may be positioned on the table 240a of the CNC device 240 and then be fixed (S1).

The CNC device 240 may have a configuration that is similar to or the same as at least a portion of the CNC device 240, which has been mentioned above. Accordingly, because the configuration of the CNC 240 may be easily understood through the above-described embodiments, a detailed description thereof will be omitted.

The base 210 of the case 200 of the electronic device may include a disk of aluminum, which is a metal material.

The first head 241 of the CNC device 240 may be disposed on the upper side of the table 240a. In order to process the upper surface of the base 210 of the case 200 of the electronic device, the table 240a, on which the case of the electronic device is positioned, may be moved in the X axis direction or the Y axis direction by the first and second movement parts (not illustrated) of the CNC device 240. Then, the first head 241 of the CNC device 240 may be moved in the Z axis direction and be rotated by the third movement part (not illustrated) of the CNC device 240. For example, the table, on which the base of the case of the electronic device is positioned, may be moved in the X axis direction or the Y axis direction by the first and second movement parts (not illustrated) of the CNC device 240 to process the upper surface of the base of the case of the electronic device, and then, the first head 241 may be moved upwards and downwards in the Z axis direction and be rotated by the third movement part (not illustrated) of the CNC device 240 to process the upper surface of the base 210 of the case 200 of the electronic device (S2). If the upper surface of the case 200 of the electronic device is completely processed, the case 200 of the electronic device may constitute the external case of the notebook. The external case may include a first case 221 or a second case 220, and the first case 221 may include a display (not illustrated) and the second case 220 may include a keypad (not illustrated). For example, the base (e.g., 210 of FIG. 2) of the case (e.g., 200 of FIG. 2) of the electronic device may include the first case (e.g., 221 of FIG. 8A) or the second case (e.g., 220 of FIG. 8A).

As described above with reference to FIGS. 5A and 5B, the second head 242 of the CNC device 240 may be rotated by the third movement part (not illustrated) to process the first pattern 231 on the side surface of the base 210 of the case 200 of the electronic device. The first pattern 231 may include a pattern of a transverse line shape (S3).

As described above with reference to FIGS. 6A and 6B, the third head 243 of the CNC device 240 may be moved and rotated by the first, second, and third movement parts (not illustrated) to process the second pattern 232 on the first pattern 231. For example, the third head 243 may be moved and rotated by the first, second, and third movement parts (not illustrated) to form the second pattern 232 by forming a pattern of a longitudinal line shape on the pattern of the transverse line shape of the first pattern 231. Accordingly, the second pattern 232 may include a pattern of a diamond shape (S4).

For a high gloss of the case 200 of the electronic device, the upper surface and the side surface of the base 210 of the case 200 of the electronic device may be processed through sand blasting (S5).

Similarly, for a high gloss of the case 200 of the electronic device, the upper surface and the side surface of the base 210 of the case 200 of the electronic device may be processed through anodizing (S6).

As described above with reference to FIGS. 7A and 7B, the first and second patterns processed on the side surface of the base 210 of the case 200 of the electronic device may be processed by the fourth head 244 of the CNC device 240 through dia-cutting (S7).

An external appearance of the case 200 of the electronic device can be realized to have a design of a refined and detailed pattern shape by forming the first and second patterns 232 on the upper surface and the side surface of the base 210 of the case 200 of the electronic device through processing of the first, second, third, and fourth heads 241, 242, 243, and 244 of the CNC device 240. Accordingly, the external appearance of the case 200 of the electronic device may be made appealing.

According to an embodiment, the first pattern 231 may include at least one of a pattern of a transverse line shape or a pattern of a longitudinal line shape. When the first pattern of a longitudinal line shape is selected and processed on the side surface of the base 210 of the second case 200, first, a pattern of a longitudinal line shape may be formed on the side surface of the base 210 of the second case 200 by using the third head 243, and then, a pattern of a transverse line shape may be formed on the pattern of the longitudinal line shape by using the second head 242. Then, the second pattern 232 that is a pattern of a diamond shape may be formed on the side surface of the base 210 of the case 200 of the electronic device.

In this way, when the first pattern 231 of a longitudinal line shape is selected and processed on the side surface of the base 210 of the case 200 of the electronic device may be processed on the side surface of the base 210 of the case 200 first instead of the process of the second head 242, and then the process of the second head 242 may be performed. Accordingly, the second pattern 232 that is a pattern of the same diamond shape may be formed even though the sequences of the process of the third head 243 and the process of the second head 242 are reversed.

The side surface of the base 210 of the case 200 of the electronic device can be easily processed and the external appearance of the case 200 of the electronic device can be realized to have a design of a more refined and detailed shape by forming a pattern of a longitudinal line shape on the side surface of the base 210 of the case 200 of the electronic device first and then forming a pattern of a transverse line shape on the pattern of the longitudinal line shape. Accordingly, the external appearance of the case 200 of the electronic device may be made appealing.

Figure 9A:
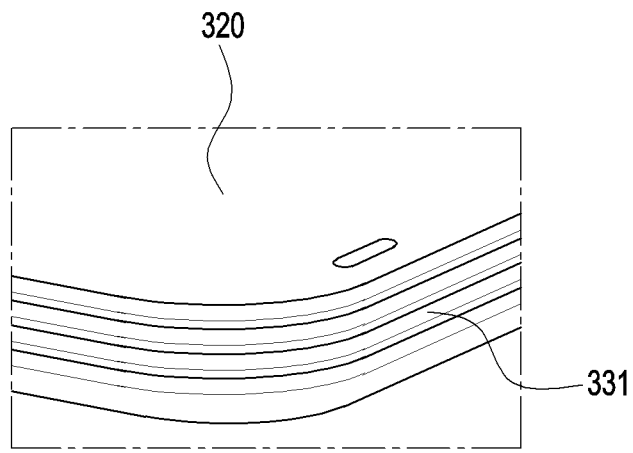
FIGS. 9A and 9B are views illustrating a process of processing a side surface of a base of a case of an electronic device with a second head of a CNC device according to various other embodiments of the disclosure.
Figure 9B:
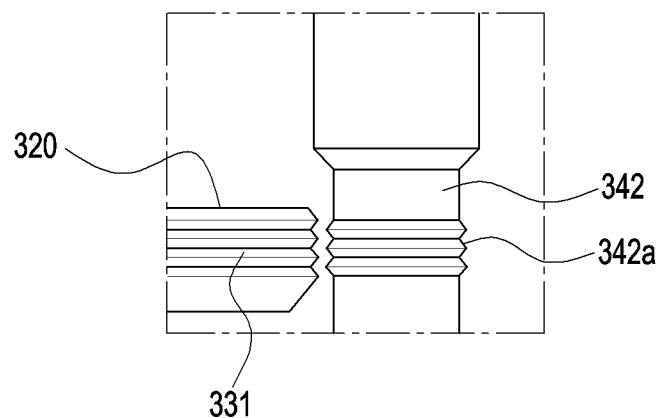
Figure 10A:
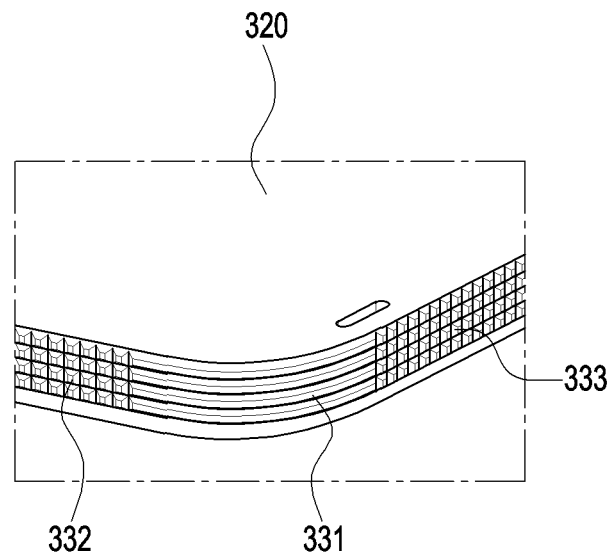
FIGS. 10A, 10B, and 10C are views illustrating a process of processing a side surface of a base of a case of an electronic device with a third head of a CNC device according to various other embodiments of the disclosure.
Figures 10B, 10C:
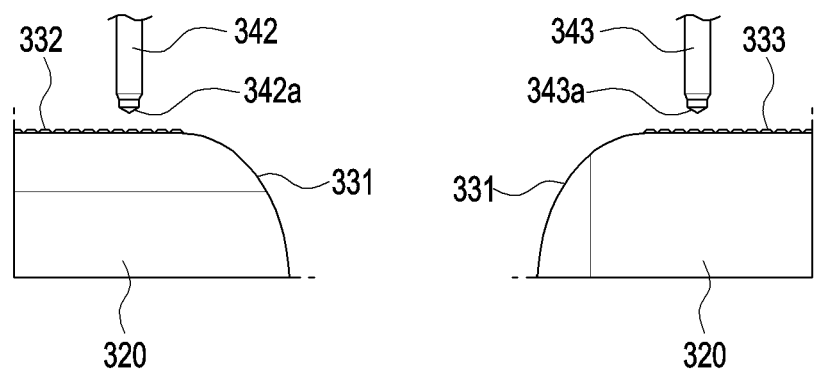
Figure 11A:
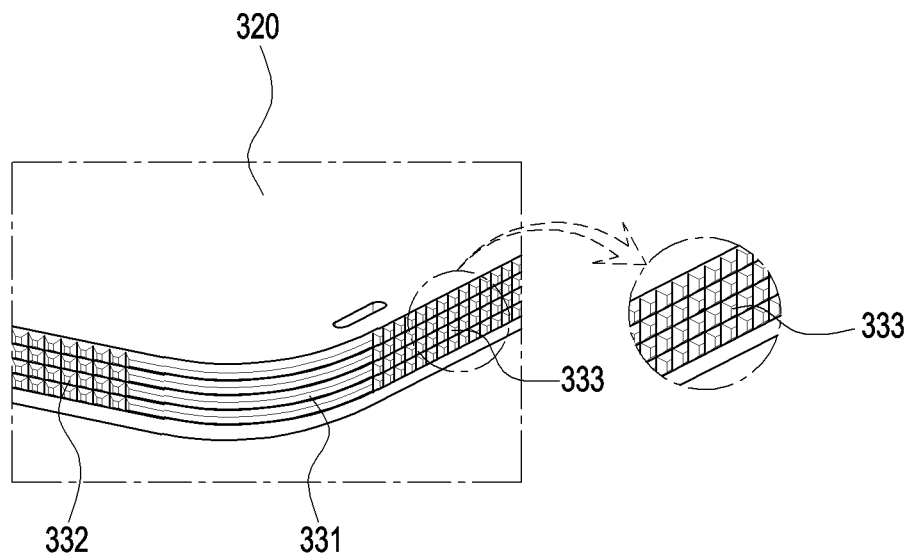
FIGS. 11A and 11B are views illustrating a process of processing a side surface of a base of a case of an electronic device with a fourth head of a CNC device according to various other embodiments of the disclosure.
Figure 11B:
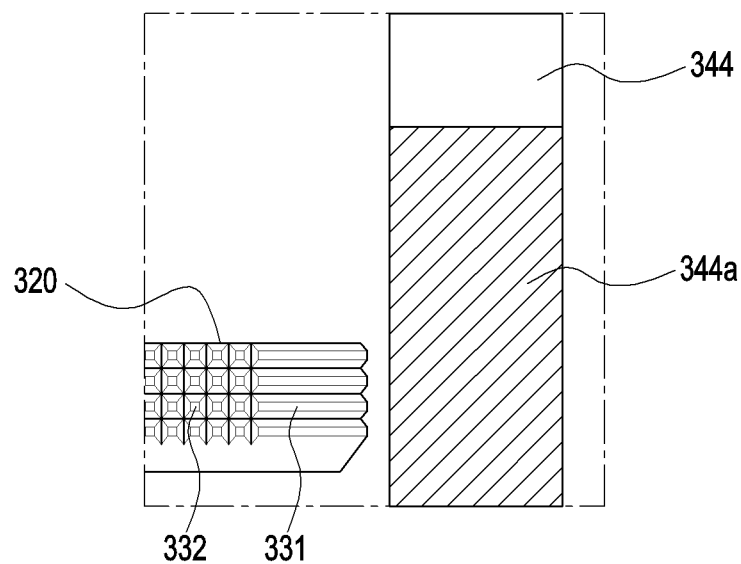

FIGS. 9A and 9B are views illustrating a process of processing a side surface of a base (e.g., 210 of FIG. 2) of a case (e.g., 200 of FIG. 2) of an electronic device with a second head 342 of a CNC device (e.g., 240 of FIG. 3) according to various embodiments of the disclosure. FIGS. 10A and 10B are views illustrating a process of processing a side surface of a base (e.g., 210 of FIG. 2) of a case (e.g., 200 of FIG. 2) of an electronic device with a third head 343 of a CNC device (e.g., 240 of FIG. 3) according to various embodiments of the disclosure. FIGS. 11A and 11B are views illustrating a process of processing a side surface of a base (e.g., 210 of FIG. 2) of a case (e.g., 200 of FIG. 2) of an electronic device with a fourth head 344 of a CNC device according to various other embodiments of the disclosure.

At least one of the components of the CNC device may be the same as or similar to at least one of the components of the CNC device 240 of FIG. 2 or 3, and a repeated description thereof will be omitted.

Referring to FIGS. 9A and 9B, an upper surface of the base (e.g., 210 of FIG. 2) of the case (e.g., 200 of FIG. 2) of the electronic device may be processed to have the shape of the external case of the notebook by moving and rotating the first head (e.g., 241 of FIG. 3). The external case of the notebook may include a first case (e.g., 221 of FIG. 8A) including a display (not illustrated) and a second case 320 including a keypad (not illustrated). In this state, the second head 342 may be made to face the side surface of the first case (e.g., 221 of FIG. 8A) or the side surface of the second case 320, and may be rotated by the third movement part (not illustrated). Then, the second head 342 may process the side surface of the first case (e.g., 221 of FIG. 8A) or the side surface of the second case 320 while being rotated along the side surface of the first case (e.g., 221 of FIG. 8A) or the side surface of the second case 320. The second head 342 may form the first pattern 331 of a transverse line shape on the side surface of the first case (e.g., 221 of FIG. 8A) or the side surface of the second case 320.

As illustrated in FIGS. 10A, 10B, and 10C, the third head 343 may be made to face the first pattern 331 formed on the side surface of the first case (e.g., 221 of FIG. 8A) or the side surface of the second case 320. In this state, the third head 343 may be moved in the X axis direction and the Y axis direction by the first and second movement parts (not illustrated), and may be moved upwards and downwards in the Z axis direction and be rotated by the third movement part (not illustrated).

As described above with reference to FIGS. 10A and 10B, if the third movement part (not illustrated) moves the third head 343 upwards and downwards in the Z axis direction and rotates the third head 343, a recess of a plurality of longitudinal line shapes may be formed in the first pattern 331 of the transverse line shape. The second pattern 332 may be formed on the side surface of the first case (e.g., 221 of FIG. 8A) or the side surface of the second case 320 by forming a recess of a plurality of longitudinal line shapes in the first pattern 331 of a transverse line shape. For example, the third head 343 may form a pattern of a plurality of longitudinal line shapes by a predetermined depth in the inside of the first pattern 331 and may form the second pattern 332 as well. A pattern of a plurality of longitudinal line shapes may be formed to cross the pattern of the transverse line shape of the first pattern 331. The second pattern 332 may include a pattern of a first diamond shape.

As described above with reference to FIGS. 10A and 10C, the third head 343 may be made to face the first pattern 331 formed on another side surface of the first case (e.g., 221 of FIG. 8A) or another side surface of the second case 320. In this state, the third head 343 may be moved in the X axis direction and the Y axis direction by the first and second movement parts (not illustrated), and may be moved upwards and downwards in the Z axis direction and be rotated by the third movement part (not illustrated).

If the third movement part (not illustrated) moves the third head 343 upwards and downwards in the Z axis direction and rotates the third head 243, a recess of a plurality of other longitudinal line shapes may be formed in the first pattern 331 of the transverse line shape. The third pattern 333 may be formed on the side surface of the first case (e.g., 221 of FIG. 8A) or the side surface of the second case 320 by forming a recess of a plurality of longitudinal line shapes in the first pattern 331 of a transverse line shape. For example, the third head 343 may form a pattern of a plurality of other longitudinal line shapes such that the pattern crosses the pattern of the transverse line shape of the first pattern 331. The third head 343 may process a third pattern 333 on another side surface of the first case (e.g., 221 of FIG. 8A) or another side surface of the second case 320, and the third pattern 333 may include a second diamond shape. For example, the pattern of the second diamond shape of the third pattern 333 may be formed different from the pattern of the first diamond shape of the second pattern 332. For example, the second pattern 332 may be processed while the third head 343 is moved upwards and downwards, and leftwards and rightwards by the first, second, and third movement parts (not illustrated), and the third pattern 333 may be processed while the third head 343 is moved leftwards and rightwards, and upwards and downwards by the first, second, and third movement parts (not illustrated) to the contrary.

As illustrated in FIGS. 11A and 11B, the second pattern 332 and the third head 333 may be processed through sand blasting or anodizing to form a high gloss.

The fourth head 344 may be made to face the second pattern 332 and the third pattern 333, and the fourth head 344 may be rotated by the third movement part (not illustrated). Then, the second pattern 332 and the third pattern 333 may be processed by the fourth head 344 through dia-cutting, and a high gloss may be formed as well.

Accordingly, as described above with reference to FIGS. 10A and 11A, a pattern of the first diamond shape of the second pattern 332 may be formed on one side surface of the first case (e.g., 221 of FIG. 8A) or one side surface of the second case 320, a pattern of the second diamond shape of the third pattern 333 may be formed on another side surface of the first case (e.g., 221 of FIG. 8A) or another side surface of the second case 320, and a pattern of the transverse line shape of the first pattern 331 may be formed at a curve formed between the one side surface and the another side surface of the first case (e.g., 221 of FIG. 8A) or the second case 320.

Figure 12:
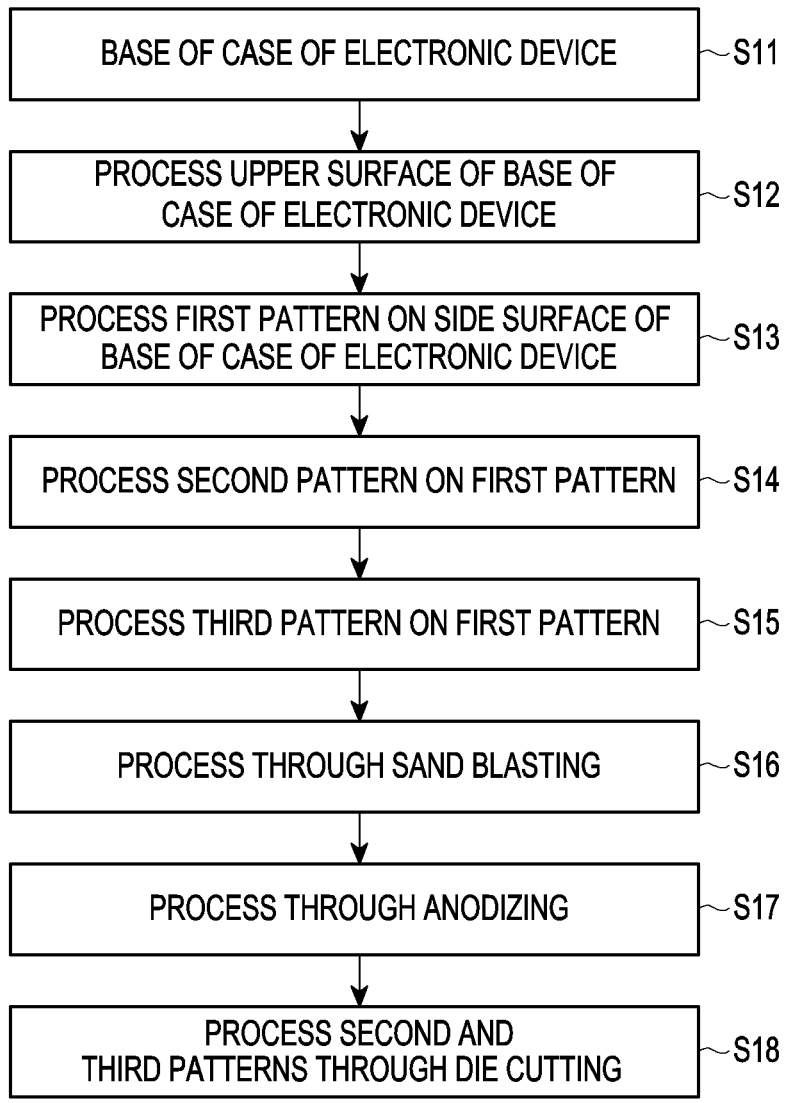
FIG. 12 is a process flowchart illustrating a method for manufacturing a case of an electronic device according to various other embodiments of the disclosure.

FIG. 12 is a process flowchart illustrating a method for manufacturing a case of an electronic device according to various other embodiments of the disclosure.

Referring to FIG. 12, the base (e.g., 210 of FIG. 2) of the case of the electronic device may be positioned on the table (e.g., 240a of FIG. 3) of the CNC device (e.g., 240 of FIG. 3) and be fixed (S11).

The CNC device (e.g., 240 of FIG. 3) may have a configuration that is similar to or the same as at least a portion of the CNC device (e.g., 240 of FIG. 3), which has been mentioned above. Accordingly, because the configuration of the CNC (e.g., 240 of FIG. 3) may be easily understood through the above-described embodiments, a detailed description thereof will be omitted.

The base (e.g., 210 of FIG. 2) of the case (e.g., 200 of FIG. 2) of the electronic device may include a disk of aluminum, which is a metal material.

The first head (e.g., 241 of FIG. 3) of the CNC device (e.g., 240 of FIG. 3) may be disposed on the upper side of the table (e.g., 240a of FIG. 3), the table (e.g., 240a of FIG. 3), on which the base 210 of the case of the electronic device is positioned, may be moved in the X axis direction or the Y axis direction by the first and second movement parts (not illustrated) of the CNC device (e.g., 240 of FIG. 3) to process the upper surface of the base (e.g., 210 of FIG. 2) of the case (e.g., 200 of FIG. 2) of the electronic device, and the first head part (e.g., 241 of FIG. 3) of the CNC device (e.g., 240 of FIG. 3) may be moved in the Z axis direction and rotated by the third movement part (not illustrated) of the CNC device as well. For example, the table (e.g., 240a of FIG. 3), on which the base (e.g., 210 of FIG. 2) of the case (e.g., 200 of FIG. 2) of the electronic device is positioned, may be moved in the X axis direction or the Y axis direction by the first and second movement parts (not illustrated) of the CNC device (e.g., 240 of FIG. 3), and the first head (e.g., 241 of FIG. 3) may be moved in the Z axis direction and rotated by the third movement part (not illustrated) of the CNC device (e.g., 240 of FIG. 3) to primarily process the upper surface of the base (e.g., 210 of FIG. 2) of the case (e.g., 200 of FIG. 2) of the electronic case (S12). If the upper surface of the case (e.g., 200 of FIG. 2) of the electronic device is completely processed, the case (e.g., 200 of FIG. 2) of the electronic device may constitute the external case of the notebook. The external case of the notebook may include a first case (e.g., 221 of FIG. 8A) including a display (not illustrated) and a second case (e.g., 220 of FIG. 8A) including a keypad (not illustrated). For example, the base (e.g., 210 of FIG. 2) of the case (e.g., 200 of FIG. 2) of the electronic device may include the first case (e.g., 221 of FIG. 8A) or the second case (e.g., 220 of FIG. 8A).

In this way, the first pattern (e.g., 331 of FIG. 9A) may be secondarily processed on a side surface of the second case (e.g., 220 of FIG. 8A) of the electronic device, which has been primarily processed. As illustrated in FIGS. 9A and 9B, the second head 342 of the CNC device (e.g., 240 of FIG. 3) may be rotated by the third movement part (not illustrated) to process the first pattern 331 on the side surface of the second case 320 of the electronic device. The first pattern 331 may include a pattern of a transverse line shape.

In this state, the second case 320, which has been secondarily processed, may be tertiarily processed to have a second pattern (e.g., 332 of FIG. 10B) and a third pattern (e.g., 333 of FIG. 10C) on the first pattern (e.g., 331 of FIG. 10) while the third head (e.g., 343 of FIG. 10C) of the CNC device (e.g., 240 of FIG. 3) is moved and rotated by the first, second, and third movement parts (not illustrated). For example, the second pattern (e.g., 332 of FIG. 10B) and the third pattern (e.g., 333 of FIG. 10C) may be formed by forming a pattern of a longitudinal line shape on a pattern of a transverse line pattern of the first pattern (e.g., 331 of FIG. 10C) while the third head (e.g., 343 of FIG. 10C) is moved and rotated by the first, second, and third movement parts (not illustrated). For example, a pattern of the first diamond shape of the second pattern (e.g., 332 of FIG. 10B) may be formed on one side surface of the base (e.g., 210 of FIG. 2) of the case of the electronic device (S13), a pattern of the second diamond shape of the third pattern (e.g., 333 of FIG. 10C) may be formed on another side surface of the base (e.g., 210 of FIG. 2) of the case of the electronic device (S15), and a pattern of the transverse line shape of the first pattern (e.g., 331 of FIG. 10A) may be formed at a curve formed between the one side surface and the another side surface of the base (e.g., 210 of FIG. 2) of the case of the electronic device. The base (e.g., 210 of FIG. 2) of the case of the electronic device may constitute the second case (e.g., 320 of FIG. 10A).

In this state, for a high gloss of the second case (e.g., 320 of FIG. 10A), the upper surface and the side surface of the second case 320 may be processed through sand blasting (S16).

Similarly, for a high gloss of the second case (e.g., 320 of FIG. 10A), the upper surface and the side surface of the second case (e.g., 320 of FIG. 10) may be processed through anodizing (S17).

The first, second, and third patterns (e.g., 331 of FIG. 10) (e.g., 332 of FIG. 10) (e.g., 333 of FIG. 10) processed on the side surface of the second case (e.g., 320 of FIG. 10) may be processed by the fourth head (e.g., 344 of FIG. 11B) of the CNC device (e.g., 240 of FIG. 3) through dia-cutting (S18).

In this way, the first pattern (e.g., 331 of FIG. 10A), the pattern of the first diamond shape of the second pattern (e.g., 332 of FIG. 10B), and the pattern of the second diamond shape of the third pattern (e.g., 333 of FIG. 10C) are formed on the upper surface and the side surface of the case (e.g., 320 of FIG. 10A) of the electronic device through processing of the first head (e.g., 241 of FIG. 3), the second head (e.g., 242 of FIG. 5B), the third head (e.g., 243 of FIG. 6B), and the fourth head (e.g., 244 of FIG. 7B) of the CNC device (e.g., 240 of FIG. 3), whereby a design of a refined and detailed pattern shape can be realized on a side surface of the case (e.g., 320 of FIG. 10A) of the electronic device, a shape of a higher quality can be formed by forming the patterns of the first and second diamond shapes on the side surface of the case (e.g., 320 of FIG. 10A) of the electronic device, and a more refined and precise design can be realized. Accordingly, the external appearance of the case of the electronic device may be made more appealing.

Figure 13:
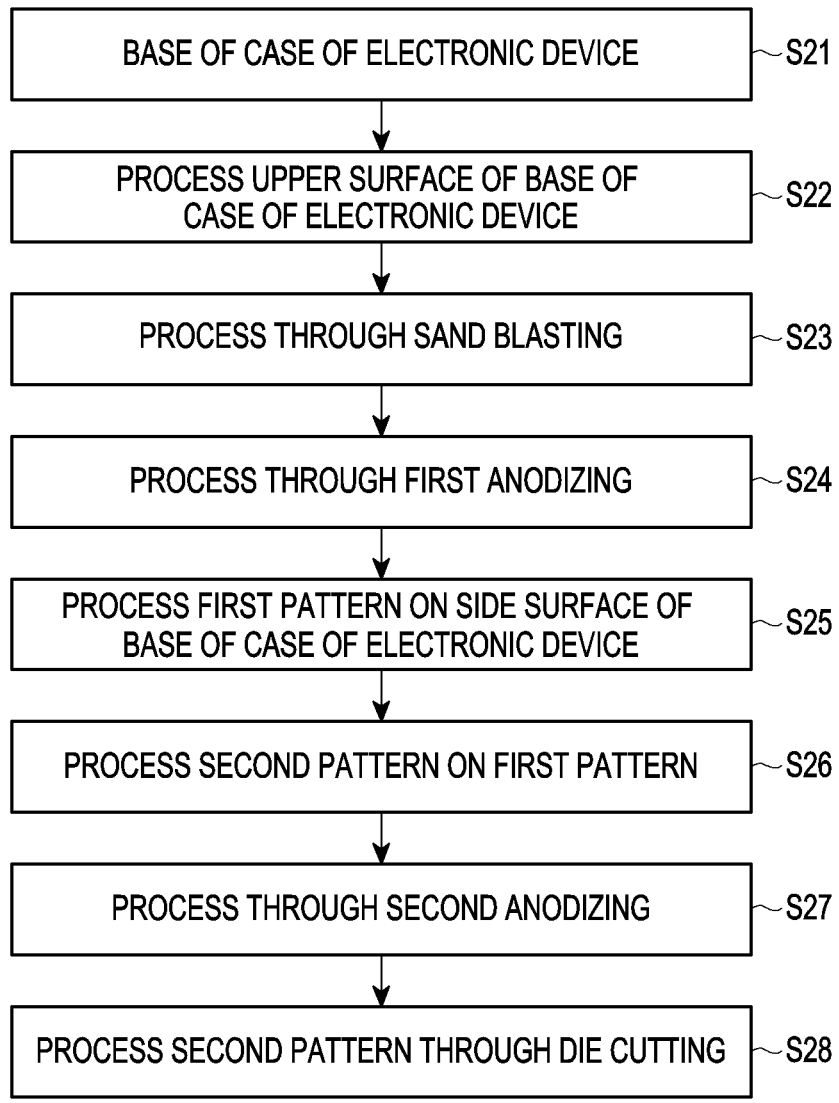
FIG. 13 is a process flowchart illustrating a method for manufacturing a case of an electronic device according to various other embodiments of the disclosure.

FIG. 13 is a process flowchart illustrating a method for manufacturing a case (e.g., 200 of FIG. 2) of an electronic device according to various other embodiments of the disclosure.

Referring to FIG. 13, the base (e.g., 210 of FIG. 2) of the case (e.g., 200 of FIG. 2) of the electronic device may be positioned on the table (e.g., 240a of FIG. 3) of the CNC device (e.g., 240 of FIG. 3) and be fixed (S21).

The CNC device (e.g., 240 of FIG. 3) may have a configuration that is similar to or the same as at least a portion of the CNC device (e.g., 240 of FIG. 3), which has been mentioned above. Accordingly, because the configuration of the CNC (e.g., 240 of FIG. 3) may be easily understood through the above-described embodiments, a detailed description thereof will be omitted.

The base (e.g., 210 of FIG. 2) of the case (e.g., 200 of FIG. 2) of the electronic device may include a disk of aluminum, which is a metal material.

The first head (e.g., 241 of FIG. 3) of the CNC device (e.g., 240 of FIG. 3) may be disposed on the upper side of the table (e.g., 240a of FIG. 3). In order to process the upper surface of the base (e.g., 210 of FIG. 2) of the case (e.g., 200 of FIG. 2) of the electronic device, the table (e.g., 240a of FIG. 3), on which the case of the electronic device is positioned, may be moved in the X axis direction or the Y axis direction by the first and second movement parts (not illustrated) of the CNC device (e.g., 240 of FIG. 3). Then, the first head (e.g., 241 of FIG. 3) of the CNC device (e.g., 240 of FIG. 3) may be moved in the Z axis direction and be rotated by the third movement part (not illustrated) of the CNC device (e.g., 240 of FIG. 3). For example, the first head (e.g., 241 of FIG. 3) may be moved in the Z axis direction and rotated by the third movement part (not illustrated) of the CNC device (e.g., 240 of FIG. 3) to process the upper surface of the base (e.g., 210 of FIG. 2) of the case (e.g., 200 of FIG. 2) of the electronic device (S22). If the upper surface of the case (e.g., 200 of FIG. 2) of the electronic device is completely primarily processed, the case (e.g., 200 of FIG. 2) of the electronic device may constitute the external case of the notebook. The external case of the notebook may include a first case (e.g., 221 of FIG. 8A) including a display (not illustrated) and a second case (e.g., 220 of FIG. 8A) including a keypad (not illustrated). For example, the base (e.g., 210 of FIG. 2) of the case (e.g., 200 of FIG. 2) of the electronic device may include the first case (e.g., 221 of FIG. 8A) or the second case (e.g., 220 of FIG. 8A).

For a high gloss of the case (e.g., 200 of FIG. 2) of the electronic device, the upper surface and the side surface of the base (e.g., 210 of FIG. 2) of the case (e.g., 200 of FIG. 2) of the electronic device may be processed through sand blasting (S23).

Similarly, for a high gloss of the case (e.g., 200 of FIG. 2) of the electronic device, the upper surface and the side surface of the base (e.g., 210 of FIG. 2) of the case (e.g., 200 of FIG. 2) of the electronic device may be processed through primary anodizing (S24).

The second head (e.g., 242 of FIG. 5B) of the CNC device (e.g., 240 of FIG. 3) may be rotated by the third movement part (not illustrated) to process the first pattern (e.g., 231 of FIG. 5B) on the side surface of the base (e.g., 210 of FIG. 2) of the case (e.g., 200 of FIG. 2) of the electronic device. The first pattern (e.g., 231 of FIG. 5B) may include a pattern of a transverse line shape (S25).

The third head (e.g., 243 of FIG. 6B) of the CNC device (e.g., 240 of FIG. 3) may be moved and rotated by the first, second, and third movement parts (not illustrated) to process the second pattern (e.g., 232 of FIG. 6B) on the first pattern (e.g., 231 of FIG. 5B). The second pattern (e.g., 232 of FIG. 6B) may be formed by forming a pattern of a longitudinal line shape on a pattern of a transverse line pattern of the first pattern (e.g., 231 of FIG. 5B) while the third head (e.g., 243 of FIG. 6B) is moved and rotated by the first, second, and third movement parts (not illustrated). Accordingly, the second pattern (e.g., 232 of FIG. 6B) may include a pattern of a diamond shape (S26).

Similarly, for a high gloss of the case (e.g., 200 of FIG. 2) of the electronic device, the upper surface and the side surface of the base (e.g., 210 of FIG. 2) of the case (e.g., 200 of FIG. 2) of the electronic device may be processed through secondary anodizing (S27).

The second pattern (e.g., 232 of FIG. 6B) processed on the side surface of the base (e.g., 210 of FIG. 2) of the case (e.g., 200 of FIG. 2) of the electronic device may be processed by the fourth head (e.g., 244 of FIG. 7B) of the CNC device (e.g., 240 of FIG. 3) through dia-cutting (S28).

Accordingly, a sand blasting process and a first anodizing process may be performed to process the side surface of the base (e.g., 210 of FIG. 2) of the case (e.g., 200 of FIG. 2) of the electronic device, and after the second pattern (e.g., 232 of FIG. 6B) is formed on the upper surface and the side surface of the base (e.g., 210 of FIG. 2) of the case (e.g., 200 of FIG. 2) of the electronic device through processing of the first head (e.g., 241 of FIG. 3), the second head (e.g., 242 of FIG. 5B), the third head (e.g., 243 of FIG. 6B), and the fourth head (e.g., 244 of FIG. 7B) of the CNC device (e.g., 240 of FIG. 3), a second anodizing process in turn may be performed. For example, two colors can be simultaneously realized on the case of the electronic device through the first and second anodizing processes, a high gloss of the external appearance of the case (e.g., 200 of FIG. 2) of the electronic device can be further improved, and a design of a more refined and detailed pattern shape can be realized. Accordingly, the external appearance of the case (e.g., 200 of FIG. 2) of the electronic device may be made appealing.

According to various embodiments of the disclosure, a case of an electronic device may include: an external case formed by processing an upper surface of a base of the case of the electronic device with a first head of a CNC device; and at least one pattern formed by processing a side surface of the external case with second and third heads of the CNC device, wherein the at least one pattern includes first and second patterns, and wherein the first pattern is processed on the side surface of the external case with the second head, and the second pattern is processed on the first pattern with the third head.

According to various embodiments of the disclosure, the material of the base of the case of the electronic device may include at least one of a metal material, a synthetic resin material, a wood material, or an artificial marble material, and the metal material may include at least one of aluminum, magnesium, titanium, and stainless steel.

According to various embodiments of the disclosure, the external case may include at least one of a notebook case, a mobile communication terminal case, a smartphone case, a tablet case, an electronic notebook case, a portable multimedia player case, a desktop/laptop computer case, and a navigation device case.

According to various embodiments of the disclosure, the CNC device may include: a table, on which the base of the case of the electronic device is positioned; first and second movement parts configured to move the table, on which the base of the case of the electronic device is positioned, in the X axis direction or the Y axis direction; the first head disposed on the upper side of the table and configured to, when the table, on which the base of the case of the electronic device is positioned, is moved in the X axis direction or the Y axis direction by the first and second movement parts so that the first head processes the upper surface of the base of the case of the electronic device, be moved in the Z axis direction and rotated by a third movement part to process the upper surface of the base of the case of the electronic device; the third movement part configured to move and rotate the first head in the Z axis direction; the second head rotated by the third movement part to process the first pattern on the side surface of the base of the case of the electronic device; the third head moved and rotated by the first, second, and third movement parts to process the second pattern on the side surface of the base of the case of the electronic device; a fourth head rotated by the third movement part to process the second pattern on the side surface of the base of the case of the electronic device; at least one driving motor configured to move the first, second, and third movement parts; and a controller configured to control the at least one driving motor.

According to various embodiments of the disclosure, the first pattern may include at least one of a pattern of a transverse line shape or a pattern of a longitudinal line shape.

According to various embodiments of the disclosure, the second pattern may include at least one of a dual pattern, a pattern of a jewelry shape, and a pattern of a diamond shape.

According to various embodiments of the disclosure, the third head may be moved and rotated by the third movement part to process a third pattern on the first pattern.

According to various embodiments of the disclosure, the case of the electronic device may be manufactured through: an operation of, when the table, on which the base of the case of the electronic device is positioned, is moved in the X axis direction or the Y axis direction by the first and second movement parts of the CNC device to process the upper surface of the base of the case of the electronic device, moving rotating the first head of the CNC device in the Z axis direction and rotating the first head with the third movement part to process the upper surface of the case of the electronic device; an operation of rotating the third movement part with the second head of the CNC device to process the first pattern on the side surface of the base of the case of the electronic device; an operation of moving and rotating the third head of the CNC device with the first, second, and third movement parts to process the second pattern on the first pattern; an operation of processing the upper surface and the side surface of the base of the case of the electronic device through sand blasting; an operation of processing the upper surface and the side surface of the base of the electronic device through anodizing; and an operation of processing the first pattern processed on the side surface of the base of the case of the electronic device with a fourth head of the CNC device through dia-cutting.

According to various embodiments of the disclosure, the case of the electronic device may be manufactured through: an operation of, when the table, on which the base of the case of the electronic device is positioned, is moved in the X axis direction or the Y axis direction by the first and second movement parts of the CNC device to process the upper surface of the base of the case of the electronic device, moving the first head of the CNC device and rotating the first head with the third movement part to process the upper surface of the case of the electronic device; an operation of rotating the second head with the third movement part to process the first pattern on the side surface of the base of the case of the electronic device; an operation of moving and rotating the third head of the CNC device with the first, second, and third movement parts to process the second pattern on the first pattern; an operation of moving and rotating the third head of the CNC device with the first, second, and third movement parts to process the third pattern on the first pattern; an operation of processing the upper surface and the side surface of the base of the case of the electronic device through sand blasting; an operation of processing the upper surface and the side surface of the base of the case of the electronic device through anodizing; and an operation of processing the second patterns processed on the side surface of the base of the case of the electronic device with a fourth head of the CNC device through dia-cutting.

According to various embodiments of the disclosure, the second and third patterns may be processed while the third head is moved upwards and downwards and leftwards and rightwards, or leftwards and rightwards and upwards and downwards by the first, second, and third movement parts.

According to various embodiments of the disclosure, the case of the electronic device may be manufactured through: an operation of, when the table, on which the base of the case of the electronic device is positioned, is moved in the X axis direction or the Y axis direction by the first and second movement parts of the CNC device to process the upper surface of the base of the case of the electronic device, moving the first head of the CNC device and rotating the first head with the third movement of the CNC device part to process the upper surface of the case of the electronic device; an operation of processing the base of the case of the electronic device through sand blasting; an operation of processing the base of the case of the electronic device through first anodizing; an operation of rotating the third movement part with the second head of the CNC device to process the first pattern on the side surface of the base of the case of the electronic device; an operation of moving and rotating the third head of the CNC device with the first, second, and third movement parts to process the second pattern on the first pattern; an operation of processing the upper surface and the side surface of the base of the case of the electronic device through second anodizing; and an operation of processing the second pattern processed on the side surface of the base of the case of the electronic device with a fourth head of the CNC device through dia-cutting.

It is noted by those skilled in the art to which the disclosure pertains that the case of the electronic device, and the method for manufacturing the same according to various embodiments of the disclosure, which have been described above, are not limited by the above-mentioned embodiments and the drawings, but may be variously replaced, modified, and changed without departing from the scope of the disclosure.

What is claimed is:

1. A case of an electronic device comprising:
an external case formed by processing an upper surface of a base of the case of the electronic device with a first head of a CNC device; and
at least one pattern formed by processing a side surface of the external case with a second head and a third head of the CNC device,
wherein the at least one pattern comprises a first pattern, a second pattern and a third pattern, and
wherein the first pattern is formed by processing on the side surface of the external case with the second head, and the second pattern and the third pattern are formed by processing on the first pattern with the third head,
wherein the first pattern is formed of a transverse line shape on the side surface of the external case,
the second pattern is formed of a plurality of longitudinal line shapes crosses the transverse line shape of the first pattern on the side surface, and
the third pattern different from the second pattern is formed of a plurality of longitudinal line shapes crosses the transverse line shape of the first pattern on the side surface.

2. The case of claim 1, wherein the material of the base of the case of the electronic device comprises at least one of a metal material, a synthetic resin material, a wood material, or an artificial marble material, and
wherein the metal material comprises at least one of aluminum, magnesium, titanium, and stainless steel.

3. The case of claim 1, wherein the external case comprises at least one of a notebook case, a mobile communication terminal case, a smartphone case, a tablet case, an electronic notebook case, a portable multimedia player case, a desktop/laptop computer case, and a navigation device case.

* * * * *